US009468086B1

(12) United States Patent
Yeini et al.

(10) Patent No.: US 9,468,086 B1
(45) Date of Patent: Oct. 11, 2016

(54) ELECTRONIC DEVICE INCLUDING AN EXTERNALLY-MOUNTED HEAT PIPE

(71) Applicant: MOTOROLA SOLUTIONS, INC., Schaumburg, IL (US)

(72) Inventors: Avraham Yeini, Coral Springs, FL (US); Jody Akens, Weston, FL (US); Peter Gilmore, Plantation, FL (US); George Mtchedlishvili, Hallandale Beach, FL (US)

(73) Assignee: Motorola Soultions, Inc., Chicago, IL (US)

( * ) Notice: Subject to any disclaimer, the term of this patent is extended or adjusted under 35 U.S.C. 154(b) by 2 days.

(21) Appl. No.: 14/678,438

(22) Filed: Apr. 3, 2015

(51) Int. Cl.
　*H05K 7/20* (2006.01)
　*H05K 9/00* (2006.01)
　*H01L 23/427* (2006.01)
　*H05K 1/02* (2006.01)
　*H05K 1/18* (2006.01)
　*H05K 5/06* (2006.01)

(52) U.S. Cl.
　CPC ........... *H05K 1/0203* (2013.01); *H01L 23/427* (2013.01); *H05K 1/18* (2013.01); *H05K 5/061* (2013.01); *H05K 7/20336* (2013.01); *H05K 9/0022* (2013.01); *H05K 2201/064* (2013.01)

(58) Field of Classification Search
　CPC ...... H05K 7/20336; H05K 7/20663–7/20681; H05K 7/208–7/20818; H01L 23/427
　See application file for complete search history.

(56) References Cited

U.S. PATENT DOCUMENTS

| | | | |
|---|---|---|---|
| 4,912,548 A | 3/1990 | Shanker et al. | |
| 6,839,235 B2* | 1/2005 | St. Louis | H05K 7/20672 165/104.33 |
| 6,871,702 B2* | 3/2005 | Horng | H01L 23/467 165/104.33 |
| 7,385,820 B1* | 6/2008 | Chen | G06F 1/20 165/104.33 |
| 7,443,680 B1* | 10/2008 | Peng | G06F 1/20 165/104.33 |
| 8,109,321 B2* | 2/2012 | Alousi | F28D 15/0233 165/104.21 |
| 8,897,012 B2* | 11/2014 | Wang | H05K 7/20336 165/104.21 |
| 9,013,874 B2* | 4/2015 | Kaldani | H05K 7/20 165/104.33 |
| 2010/0263835 A1 | 10/2010 | Wang | |
| 2013/0118011 A1 | 5/2013 | Yang | |
| 2013/0294030 A1 | 11/2013 | Wang et al. | |
| 2014/0202666 A1* | 7/2014 | Cheng | F28F 3/06 165/104.26 |
| 2015/0219400 A1* | 8/2015 | Sasaki | H01L 23/427 165/104.26 |
| 2015/0300750 A1* | 10/2015 | Tan | F28D 15/0275 361/679.52 |

(Continued)

FOREIGN PATENT DOCUMENTS

EP　　2844052　　3/2015

OTHER PUBLICATIONS

Congatec, "Cooling Solutions for Computer-On-Modules," publicly available Dec. 2014, http://www.congatec.com/fileadmin/user_upload/Documents/Others/Cooling_Overview_Low_PDF_01.pdf.
Matsushita Electric Industrial Co., Ltd., "Panasonic Toughbook CF-29 Service Manual" (2006).

(Continued)

*Primary Examiner* — Robert J Hoffberg
(74) *Attorney, Agent, or Firm* — Michael Best & Friedrich LLP

(57) ABSTRACT

An electronic device including a housing having a container and a cover. The cover has an opening. The electronic device also includes a circuit board positioned within the container. The circuit board includes an electrical component that is aligned with the opening. The electronic device further includes a heat pipe mounted to the cover. A portion of the heat pipe extends into the opening of the cover to thermally communicate with the electrical component.

16 Claims, 4 Drawing Sheets

(56) References Cited

U.S. PATENT DOCUMENTS

2015/0354902 A1    12/2015  McDonald
2016/0088769 A1*   3/2016  Hsiao ................. H05K 7/20336
                                                                          361/700

OTHER PUBLICATIONS

PCT/US2016/022870 International Search Report and Written Opinion of the International Searching Authority dated Jun. 9, 2016 (11 pages).

* cited by examiner

ELECTRONIC DEVICE INCLUDING AN EXTERNALLY-MOUNTED HEAT PIPE

BACKGROUND OF THE INVENTION

Thermal management is a common electromechanical challenge for electronic devices that include heat-generating circuitry. In some instances, heat pipes are used to transfer heat from one location to another location. Heat pipes, however, take up a relatively large amount of space and may interfere with internal components of the devices.

Accordingly, there is a need for an improved mechanism for managing heat in electronic devices.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
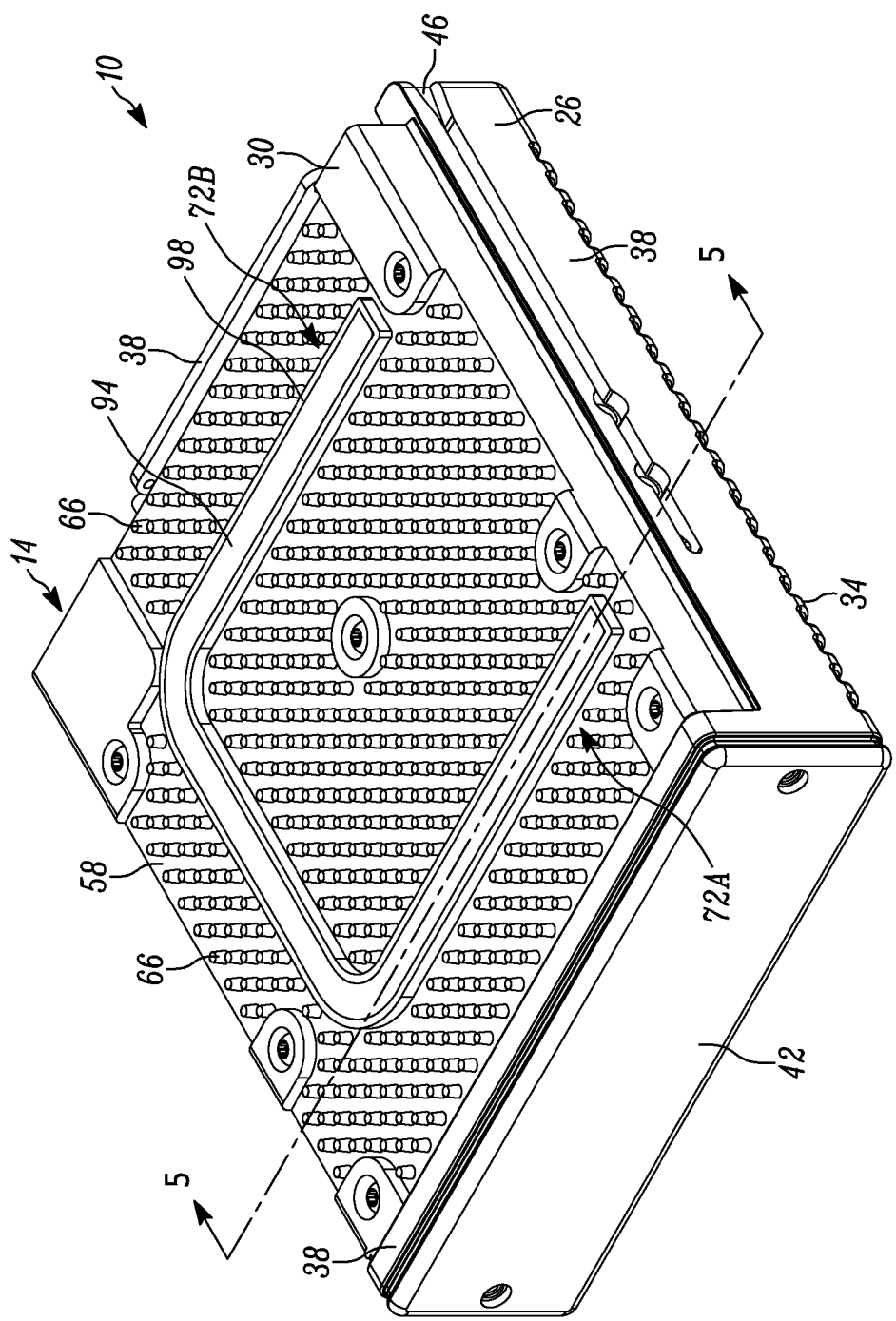
FIG. 1 is a perspective view of an electronic device including a heat pipe in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In one embodiment, the invention provides, an electronic device that comprises a housing including a container and a cover. The cover has an opening. The electronic device also comprises a circuit board positioned within the container. The circuit board includes an electrical component that is aligned with the opening in the cover. The electronic device further comprises a heat pipe mounted to the cover. A portion of the heat pipe extends into the opening of the cover to thermally communicate with the electrical component.

In another embodiment, the invention provides an electronic device comprising a sealed housing including a container and a cover. The cover has an inner surface and an outer surface. The cover also has a groove in the outer surface and an opening in communication with the groove. The opening extends through the inner surface of the cover. A circuit board is positioned within the container. The circuit board includes an electrical component that is aligned with the opening in the cover. An electromagnetic interference shield is positioned within the sealed housing. The electromagnetic interference shield separates the electrical component from other components of the circuit board. A heat pipe is positioned within the groove in the cover, and a portion of the heat pipe extends into the opening of the cover and directly contacts the electrical component to thermally communicate with the electrical component.

Figure 2:
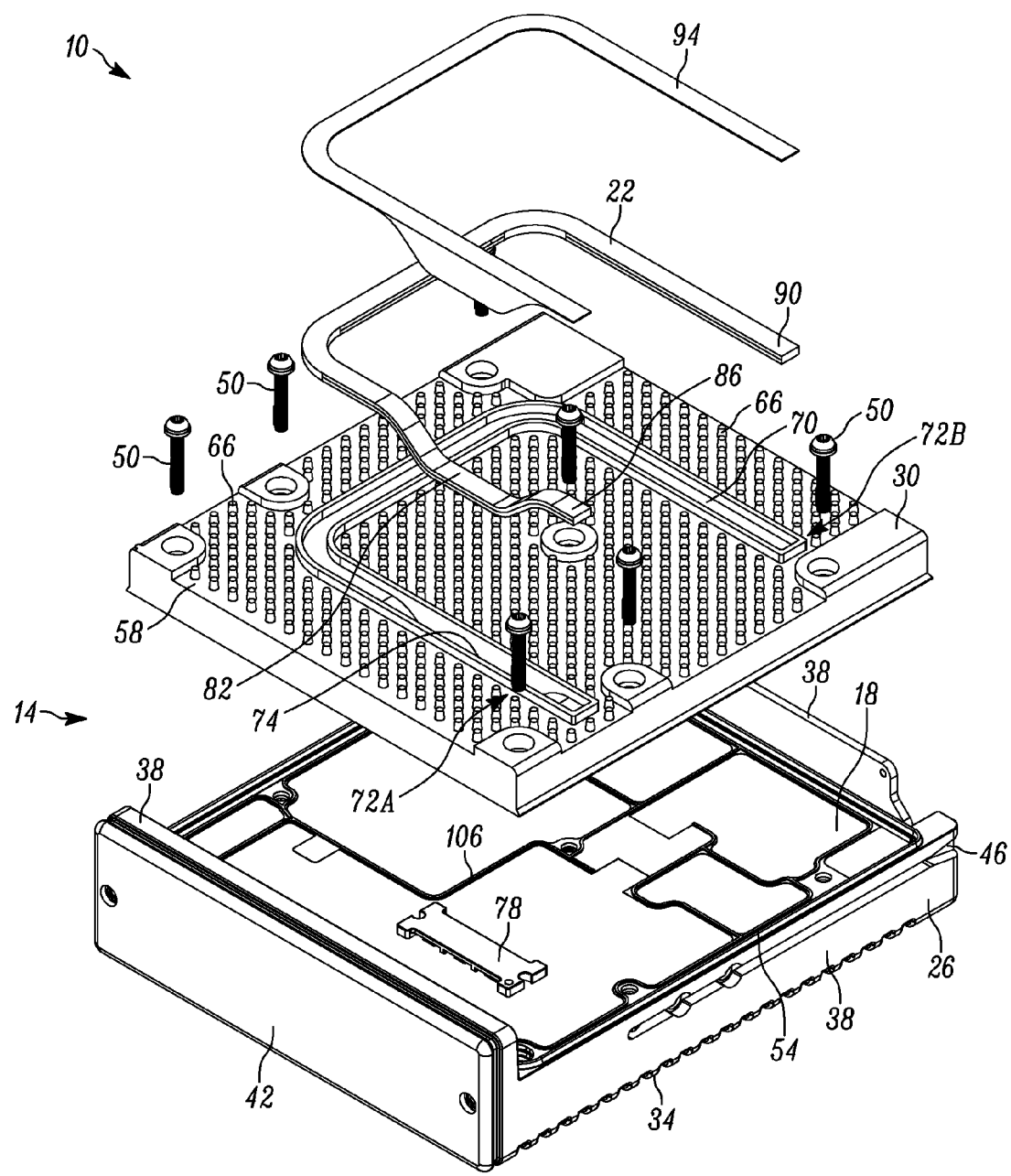
FIG. 2 is an exploded perspective view of the electronic device.

FIGS. 1 and 2 illustrate an electronic device 10. In the illustrated embodiment, the electronic device 10 is a two-way radio that is mountable in a vehicle. In other embodiments, the electronic device 10 may be, for example, a portable handheld radio, a laptop computer, a tablet computer, a pager, a smartphone, or other electronic device or electrical device in which thermal management is desired to help ensure proper performance of electronic or other electrical components.

The illustrated electronic device 10 includes a housing 14, a circuit board 18, and a heat pipe 22. The housing 14 is generally made of thermally conductive materials, such as, for example, metal, that also offer desired electrical properties. The housing 14 includes a container 26 and a cover 30. The container 26 has a base 34 and sidewalls 38 that define a volume for receiving the circuit board 18. The container 26 also includes a front panel 42 on one of the sidewalls 38. The front panel 42 can include various user interface mechanisms such as a display and actuators (e.g., buttons, knobs, etc.) (not shown) to display information and control operation of the electronic device 10. The container 26 further includes mounting features 46 for mounting the electronic device 10 to a vehicle, such as a police squad car. In the illustrated embodiment, the mounting features 46 include slots or recesses formed in the sidewalls 38. In other embodiments, the container 26 may include other means for mounting the electronic device 10 in a vehicle or stationary location. Alternatively, the container 26 may be configured to be mounted, supported, or otherwise secured in other types of environments.

The cover 30 is removably coupled to the container 26 by fasteners 50 (e.g., screws). When the cover 30 is connected to the container 26, the cover 30 and the container 26 form an enclosure for the circuit board 18. In some embodiments, such as the illustrated embodiment, a rubber gasket 54 (FIG. 2) is positioned between the container 26 and the cover 30 to form a seal to prevent water, dust, and other contaminants from entering the housing 14. In one embodiment, the seal is a hermetic seal. As such, the housing 14 is hermetically-sealed when the cover 30 is securely fastened to the container 26.

Figure 4:
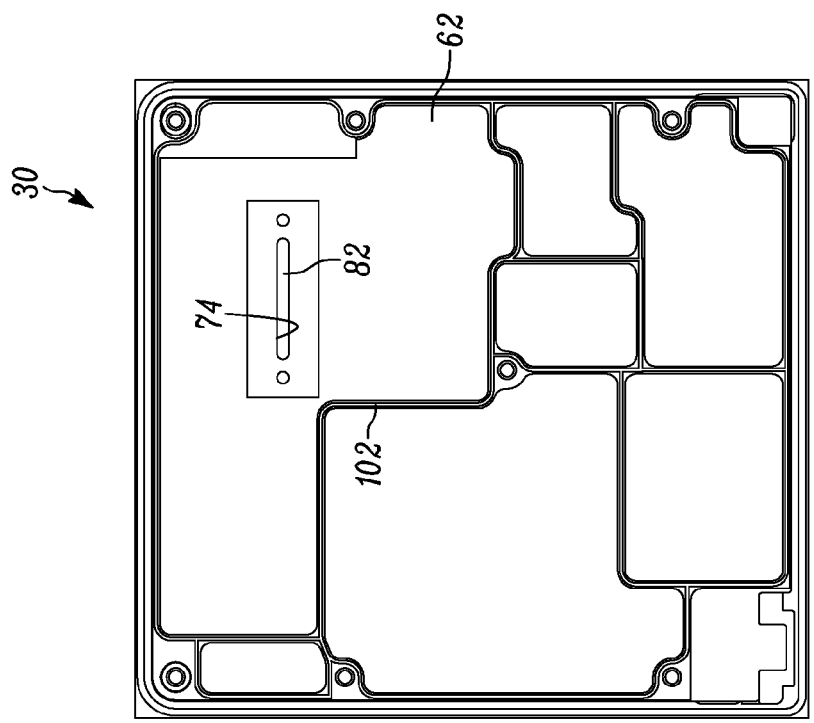
FIG. 4 is a plan view of an inner surface of the cover of the electronic device.
Figure 3:
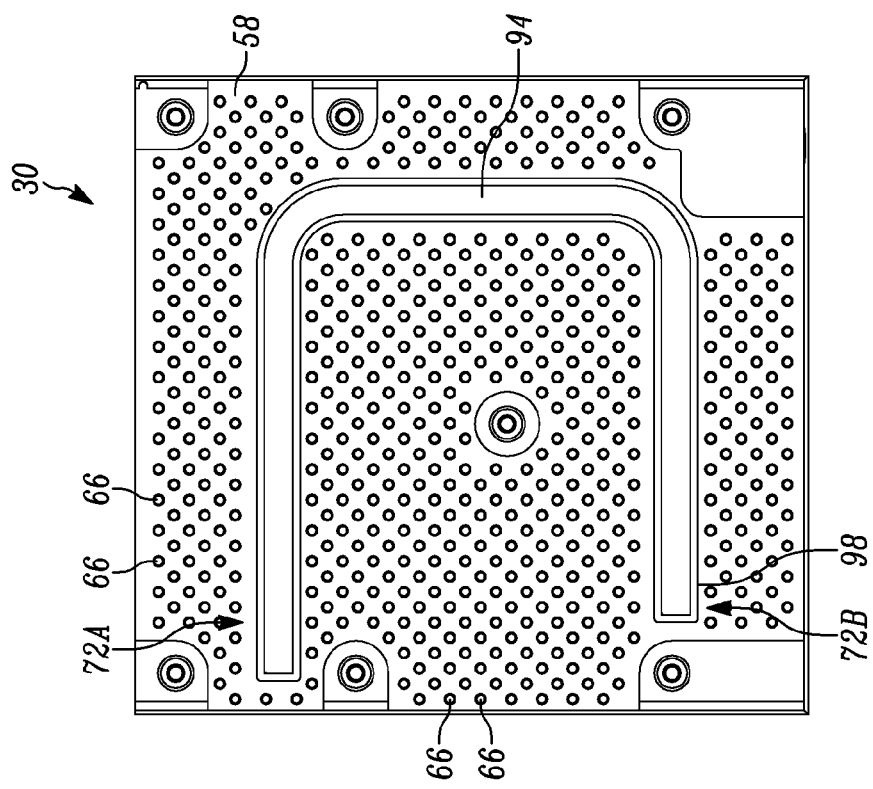
FIG. 3 is a plan view of an outer surface of a cover of the electronic device.

The illustrated cover 30 includes an outer surface 58 (FIG. 3) and an inner surface 62 (FIG. 4). The inner surface 62, sometimes referred to as the "dry side," faces the circuit board 18. The outer surface 58, or "wet side," is opposite the inner surface 62, faces away from the circuit board 18, and is exposed to the environment. As shown in FIGS. 1-3, the outer surface 58 of the cover 30 includes a plurality of heat-dissipating fins 66. The heat-dissipating fins 66 are relatively small, spaced apart projections that extend outwardly from the outer surface 58. The illustrated fins 66 are generally arranged in organized rows on the outer surface 58, but may alternatively be arranged in a different scattered or organized pattern on the outer surface 58. In some embodiments, a finned geometry may not be required and the fins 66 may be omitted.

As shown in FIG. 2, the cover 30 also includes a groove 70 formed in the outer surface 58. In the embodiment illustrated, the groove 70 extends from a first area 72A of the cover 30 to a second area 72B of the cover 30 that is spaced apart from the first area 72A. The groove 70 is configured to receive the heat pipe 22. In the illustrated embodiment, the groove 70 is generally U-shaped. In other embodiments, the groove 70 may be formed in other shapes along the outer surface 58 of the cover 30 such as, for example, a straight line, an arch or curve, a V-shape, an L-shape, an S-shape, and the like. Alternatively, the heat pipe 22 may be coupled to the cover 30 to thermally communicate with the outer surface 58 without the inclusion of the groove 70.

The cover 30 also has an opening 74 (as illustrated in FIG. 4) connected to the groove 70. The opening 74 extends from the groove 70 through the inner surface 62 of the cover 30. The opening 74 is a passageway formed through the housing 14 from the surrounding environment to the enclosure that receives the circuit board 18. The opening 74 is configured to receive a portion of the heat pipe 22 to allow the heat pipe 22 to thermally communicate with the circuit board 18.

Referring back to FIG. 2, the circuit board 18 is positioned within the container 26. The circuit board 18 includes electrical components (e.g., processors, amplifiers, transmitters, receivers, etc.) that perform the desired functions of the electronic device 10. One of the electrical components 78 is specifically illustrated in FIG. 2. The illustrated electrical component 78 may be, for example, a power amplifier that produces heat during operation of the electronic device 10. It will be appreciated by those of ordinary skill in the art that the electrical component 78 may be any component assembled to the circuit board 18 that produces heat during operation. The electrical component 78 is positioned on the circuit board 18 so that the component 78 is aligned with the opening 74 in the cover 30. In the embodiment illustrated in FIG. 5, when the cover 30 is coupled to the container 26, the opening 74 in the cover 30 lies directly over the electrical component 78. In other embodiments, the opening 74 may be offset from the component 78, provided that a path exists between the opening 74 and the component 78.

Referring back to FIG. 2, the heat pipe 22 is mounted to the cover 30. More particularly, the heat pipe 22 is positioned within the groove 70 formed in the outer surface 58 of the cover 30. The heat pipe 22 generally matches the shape and size (e.g., length) of the groove 70 so that the heat pipe 22 also extends along the outer surface 58 of the cover 30. In some embodiments, the heat pipe 22 may be soldered, brazed, glued (e.g., with a thermal epoxy or adhesive), or otherwise hermetically attached to the cover 30 to secure the heat pipe 22 within the groove 70.

The illustrated heat pipe 22 is a tube that is filled with heat transfer fluid to help the pipe spread heat over the housing 14 of the electronic device 10. In one embodiment, the heat pipe 22 is filled with water to transfer heat. Water is suitable for transferring heat in operating temperatures between about 300 Celsius and about 277° C. In other embodiments, the heat pipe 22 may be filled with other materials, such as helium, hydrogen, neon, nitrogen, argon, oxygen, methane, krypton, ethane, FREON 22, ammonia, FREON 21, FREON 11, pentane, FREON 113, acetone, methanol, FLUTEC PP2, ethanol, heptane, toluene, FLUTEC PP9, naphthalene, DOWTHERM, mercury, sulfur, cesium, rubidium, potassium, sodium, lithium, calcium, lead, indium, silver, or combinations of materials, depending on the environmental temperatures in which the electronic device 10 is expected to operate.

Figure 5:
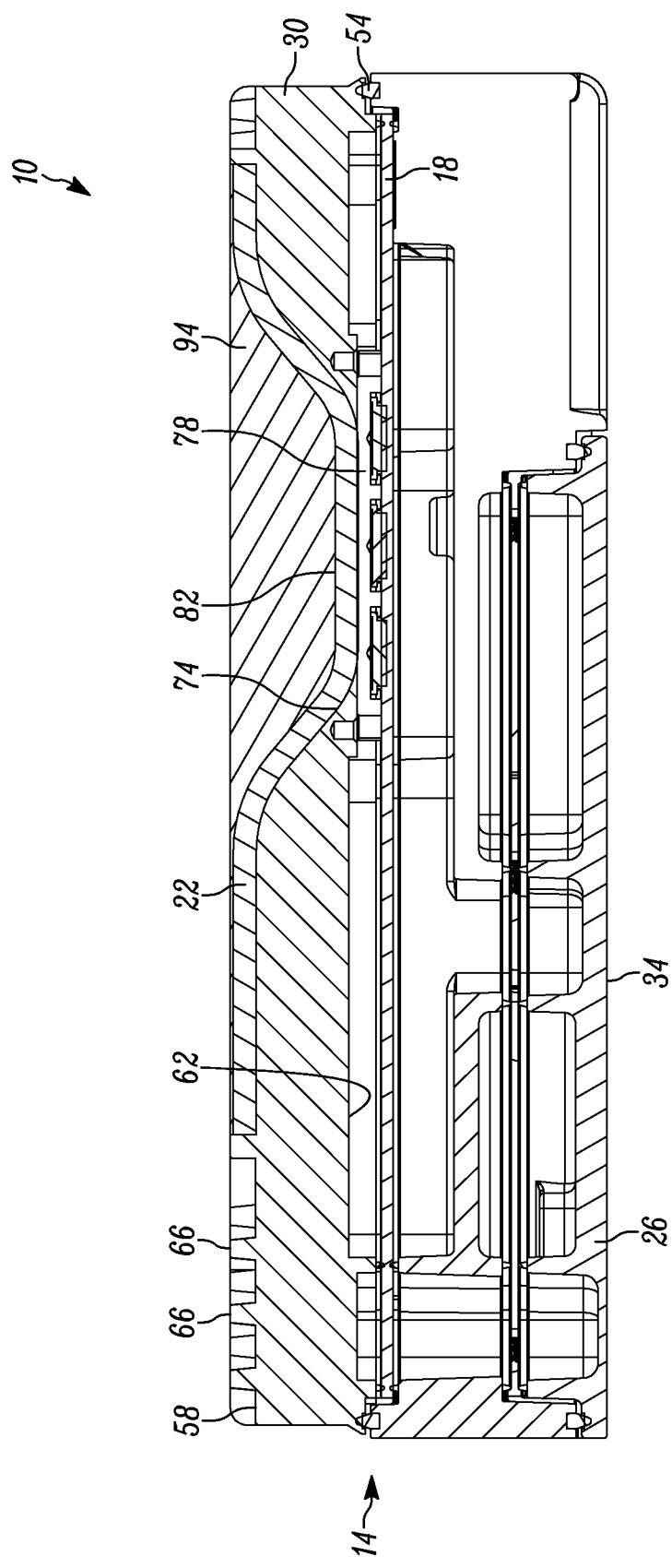
FIG. 5 is a cross-sectional view of the electronic device taken along section line 5-5 of FIG. 1.

The illustrated heat pipe 22 includes a bent portion 82. The bent portion 82 is a section of the heat pipe 22 that is formed out of plane with the remainder of the heat pipe 22. In the illustrated embodiment, the bent portion 82 is formed adjacent a first end 86 of the heat pipe 22. As shown in FIG. 5, the bent portion 82 of the heat pipe 22 extends into the opening 74 in the cover 30 to thermally communicate with the electrical component 78 (e.g., the power amplifier) of the circuit board 18. The bent portion 82 of the heat pipe 22 directly contacts or abuts the electrical component 78 to receive heat from the component 78. The heat causes the heat transfer fluid (e.g., water) in the heat pipe 22 to boil, or otherwise change phase. When the heat transfer fluid boils and expands, the fluid moves away from the bent portion 82 to a remote, second end 90 of heat pipe 22. As the heat transfer fluid moves from the first end 86 (i.e., the bent portion 82) of the heat pipe 22 to the second end 90 of the heat pipe 22, the fluid transfers the heat generated by the electrical component 78 over the cover 30. Since the heat pipe 22 generally extends across the entire cover 30, heat is dissipated over the entire cover 30. In addition, the fins 66 formed on the outer surface 58 of the cover 30 help dissipate the heat from the cover 30 to the surrounding environment.

In some embodiments, the heat pipe 22 does not include a bent portion 82. Rather, the heat pipe 22 may extend straight from (e.g., perpendicular to) the electrical component 78 to the outer surface 58 of the cover 30. Alternatively, the cover 30 may be relatively thin (e.g., approximately the same thickness of the heat pipe 22) so that the heat pipe 22 extends generally parallel to the electrical component 78, but still directly contacts the component 78.

In the illustrated embodiment, the heat pipe 22 is in thermal contact with the cover 30 such that heat is transferred along dimensions of the housing 14. In other embodiments, the heat pipe 22 may be thermally coupled only to the heat source (e.g., the electrical component 78) so that heat is transferred directly from the heat pipe 22 to the surrounding environment. In further embodiments, the heat pipe 22 may be coupled to a thermally advantageous location on the electronic device 10, such as an area of large thermal mass or a heat sink.

In the illustrated embodiment, the electronic device 10 also includes a sealing member 94 positioned at least partially within the groove 70. The sealing member 94 encloses the heat pipe 22 within the groove 70. In other words, the sealing member 94 helps fill the groove 70 so that the housing 14 of the electronic device 10 remains properly (for example, hermetically) sealed. As shown in FIG. 1, the sealing member 94 is generally flush with an upper edge 98 of the cover 30 that defines the groove 70. The sealing member 94 and the upper edge 98 extend from the outer surface 58 of the cover 30 generally the same distance (i.e., height) as the heat-dissipating fins 66.

In the illustrated embodiment, the sealing member 94 is composed of a thermal epoxy or thermally-conductive epoxy, such as Thermalbond® manufactured by Saint-Gobain. In other embodiments, the sealing member 94 may be composed of solder, a silicone-based sealing compound, or the like. In further embodiments, the sealing member 94 may be a pre-formed gasket this is placed within and fills the groove 70. In some embodiments, the sealing member 94 may be omitted. In such embodiments, the heat pipe 22 itself may fill and seal the groove 70 in the cover 30.

As shown in FIGS. 2 and 4, the illustrated electronic device 10 further includes an electromagnetic interference (EMI) shield. The EMI shield includes a first track 102 (FIG. 4) coupled to the inner surface 62 of the cover 30. The first track 102 may include, for example, a metallic gasket formed on the inner surface 62. The EMI shield also includes a second track 106 (FIG. 2) coupled to the circuit board 18. The second track 106 may include, for example, a gold line that is printed or otherwise formed on the circuit board 18. The first track 102 on the cover 30 cooperates with the second track 106 on the circuit board 18 to create the EMI shield within the housing 14 of the electronic device 10. When the cover 30 is coupled to the container 26, the first track 102 (FIG. 4) lays on top of the second track 106 (FIG. 6), connecting the tracks 102, 106 together. In this position, the tracks 102, 106 contact each other and together form a perimeter around the electrical component 78 (and other components on the circuit board 18) to separate or isolate the electrical component 78 from the other components within the electronic device 10, and from external electromagnetic interferences.

As shown in FIGS. 2 and 4, the opening 74 for the heat pipe 22 is positioned within the perimeter defined by the tracks 102, 106. This arrangement allows the heat pipe 22 to contact the electrical component 78 without disrupting the EMI shield. The heat pipe 22 only extends through the cover 30 in an area that is already bounded by the tracks 102, 106. In addition, the remainder of the heat pipe 22 is positioned on the outer surface 58 of the cover 30 so that the heat pipe 22 does not extend across and break the track 102 formed on the inner surface 58 of the cover 30.

Although the illustrated electronic device 10 is shown and described with one heat pipe 22, in other embodiments, an electronic device may include multiple heat pipes. Each heat pipe may thermally communicate with a different electrical component within the device, or may communicate with the same electrical component. In such embodiments, the housing of the electronic device may include multiple openings so that each heat pipe extends through the housing to the electrical component(s) through its own opening. The heat pipes may all be located on the same surface of the housing (e.g., the outer surface 58 of the cover 30) or may be located on different surfaces of the housing (e.g., one heat pipe on the outer surface 58 of the cover 30, one heat pipe on the sidewall 38 of the container 26, one heat pipe on the base 34 of the container 26, etc.).

In some embodiments, one heat pipe may thermally communicate with multiple electrical components. For example, the heat pipe may include an elongated bent portion that contacts two adjacent electrical components within the electronic device 10. Alternatively, the heat pipe may include multiple bent portions, each of which contacts a separate electrical component. Each bent portion may extend through a separate opening or the same opening within the cover 30 of the electronic device 10.

The externally-mounted heat pipe 22 described above facilitates dissipating heat over a widespread area of the electronic device 10. In addition, the heat pipe 22 allows the electronic device 10 to remain sealed. Furthermore, the heat pipe 22 does not interfere with or disrupt EMI shielding within the electronic device 10.

Embodiments of the invention have been tested in an electronic device with a 70 Watt heat load, such as the two-way radio illustrated in FIGS. 1 through 5. The heat pipe 22 uniformly spreads heat around the housing 14. The housing 14 radiates temperatures around about 65° Celsius to 75° Celsius. In addition, the heat source of the mobile product (i.e., the electrical component 78 in contact with the heat pipe 22) is maintained at a temperature that is about 40° Celsius to 50° Celsius lower than comparable devices without heat pipes. The net heat capacity of the mobile product is, thereby, improved by about 15 Watt to 20 Watt. To achieve similar heat-dissipation results without a heat pipe, the comparable devices would need to be, for example, about 40 percent taller.

In a portable electronic device with a 13 Watt heat load, such a handheld radio, a heat pipe transfers heat to a cooler region of the housing. In addition, the heat source of the portable product is about 15° Celsius to 20° Celsius cooler (and adjacent components are about 5° Celsius cooler) that comparable devices without heat pipes. The net heat capacity of the portable product is, thereby, improved by about 1 Watt. To achiever similar heat-dissipation results without a heat pipe, the comparable devices would need to be, for example, about 25 percent longer.

During testing, it was found that embodiments in which the heat pipe directly contacts the electrical component achieved the greatest level of cooling in comparison, for example, to embodiments in which an indirect thermal communication occurred. For example, instead of forming an opening in the housing, a depression or well may be formed and a thin layer of the housing left intact to provide indirect thermal communication between the heat pipe and the electrical component. This improves sealing of the housing, but was found to reduce cooling as the thermal transmission from the electrical component to the heat pipe occurred through the thin layer rather than directly.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An electronic device comprising:
    a housing including a container and a cover, the cover has an opening;
    a circuit board positioned within the container, the circuit board including an electrical component that is aligned with the opening in the cover; and
    a heat pipe mounted to the cover,
    wherein the cover includes an inner surface that faces the circuit board and an outer surface that is opposite the inner surface, a groove formed in the outer surface that extends across the opening from a first side of the opening to a second side that is opposite the first side, the opening extending from the inner surface to the groove so that the opening and the groove extend from the inner surface to the outer surface of the cover, the heat pipe extending along the groove formed in the outer surface and a portion of the heat pipe extending into the opening of the cover to directly contact the electrical component and to thermally communicate with the electrical component.

2. The electronic device of claim 1, wherein the heat pipe is secured within the groove.

3. The electronic device of claim 1, further comprising a sealing member positioned at least partially within the groove, wherein the sealing member encloses the heat pipe within the groove.

4. The electronic device of claim 3, wherein the sealing member includes thermal epoxy.

5. The electronic device of claim 1, wherein the housing is hermetically-sealed.

6. The electronic device of claim 5, further comprising a gasket positioned between the container and the cover.

7. The electronic device of claim 1, further comprising an electromagnetic interference shield positioned within the housing, wherein the electromagnetic interference shield separates the electrical component from other components of the circuit board.

8. The electronic device of claim 7, wherein the cover includes the inner surface that faces the circuit board, and wherein the electromagnetic interference shield includes a track coupled to the inner surface of the cover.

9. The electronic device of claim 8, wherein the opening is positioned within a perimeter defined by the track.

10. The electronic device of claim 1, wherein the cover is composed of metal and includes a plurality of heat-dissipating fins.

11. An electronic device comprising:
    a sealed housing including a container and a cover, the cover having an inner surface and an outer surface opposite the inner surface, the cover has a groove in the outer surface and an opening in communication with the groove, the groove extending across the opening from a first side of the opening to a second side that is opposite the first side, the opening extending from the inner surface of the cover to the groove so that the opening and the groove extend from the inner surface to the outer surface of the cover;
    a circuit board positioned within the container, the circuit board including an electrical component that is aligned with the opening in the cover;
    an electromagnetic interference shield positioned within the sealed housing, the electromagnetic interference shield separating the electrical component from other components of the circuit board; and
    a heat pipe positioned within the groove in the cover, a portion of the heat pipe extending into the opening of the cover and directly contacting the electrical component to thermally communicate with the electrical component.

12. The electronic device of claim 11, wherein the heat pipe is secured within the groove.

13. The electronic device of claim 11, further comprising a sealing member positioned at least partially within the groove, wherein the sealing member encloses the heat pipe within the groove.

14. The electronic device of claim 13, wherein the sealing member includes thermal epoxy.

15. The electronic device of claim 11, further comprising a gasket positioned between the container and the cover.

16. The electronic device of claim 11, wherein the electromagnetic interference shield includes a track coupled to an inner surface of the cover, and wherein the opening is positioned within a perimeter defined by the track.

* * * * *